(12) United States Patent  
Akkaraju et al.

(10) Patent No.: US 10,648,852 B2  
(45) Date of Patent: May 12, 2020

(54) IMAGING DEVICES HAVING PIEZOELECTRIC TRANSCEIVERS

(71) Applicant: EXO IMAGING INC., Oakland, CA (US)

(72) Inventors: Sandeep Akkaraju, Wellesley, MA (US); Haesung Kwon, Austin, TX (US); Brian Bircumshaw, Oakland, CA (US)

(73) Assignee: EXO IMAGING INC., Redwood City, CA (US)

( * ) Notice: Subject to any disclaimer, the term of this patent is extended or adjusted under 35 U.S.C. 154(b) by 0 days.

(21) Appl. No.: 15/951,121

(22) Filed: Apr. 11, 2018

(65) Prior Publication Data

US 2019/0316958 A1   Oct. 17, 2019

(51) Int. Cl.

| | | |
|---|---|---|
| *G01N 29/00* | (2006.01) | |
| *H01L 41/00* | (2013.01) | |
| *G01H 11/08* | (2006.01) | |
| *G01S 15/02* | (2006.01) | |
| *G01N 29/07* | (2006.01) | |
| *H01G 5/00* | (2006.01) | |
| *H01L 41/113* | (2006.01) | |
| *H01L 41/18* | (2006.01) | |
| *B81B 3/00* | (2006.01) | |

(52) U.S. Cl.  
CPC ............ *G01H 11/08* (2013.01); *G01N 29/07* (2013.01); *G01S 15/02* (2013.01); *H01G 5/00* (2013.01); *H01L 41/1132* (2013.01); *H01L 41/183* (2013.01); *B81B 3/0021* (2013.01)

(58) Field of Classification Search  
CPC ........ G01H 11/08; G01N 29/07; G01S 15/02; H01G 5/00; H01L 41/1132; H01L 41/183; B81B 3/0021  
See application file for complete search history.

(56) References Cited

U.S. PATENT DOCUMENTS

| | | | |
|---|---|---|---|
| 10,106,397 B1 * | 10/2018 | Kim | ............. B01L 3/502761 |
| 2005/0148132 A1 | 7/2005 | Wodnicki | |
| 2009/0250729 A1 * | 10/2009 | Lemmerhirt | ............. A61B 8/00 257/254 |
| 2010/0256501 A1 * | 10/2010 | Degertekin | ............ B06B 1/0292 600/463 |
| 2010/0327695 A1 | 12/2010 | Goel et al. | |
| 2013/0039147 A1 | 2/2013 | Witte et al. | |
| 2013/0294201 A1 * | 11/2013 | Hajati | ................. H01L 41/047 367/138 |
| 2017/0368574 A1 * | 12/2017 | Sammoura | ............ B06B 1/0603 |

* cited by examiner

*Primary Examiner* — Zhihan Zhou  
(74) *Attorney, Agent, or Firm* — Wilson Sonsini Goodrich & Rosati

(57) ABSTRACT

A micromachined ultrasonic transducer (MUT). The MUT includes: a substrate; a membrane suspending from the substrate; a bottom electrode disposed on the membrane; a piezoelectric layer disposed on the bottom electrode and an asymmetric top electrode is disposed on the piezoelectric layer. The areal density distribution of the asymmetric electrode along an axis has a plurality of local maxima, wherein locations of the plurality of local maxima coincide with locations where a plurality of anti-nodal points at a vibrational resonance frequency is located.

23 Claims, 15 Drawing Sheets

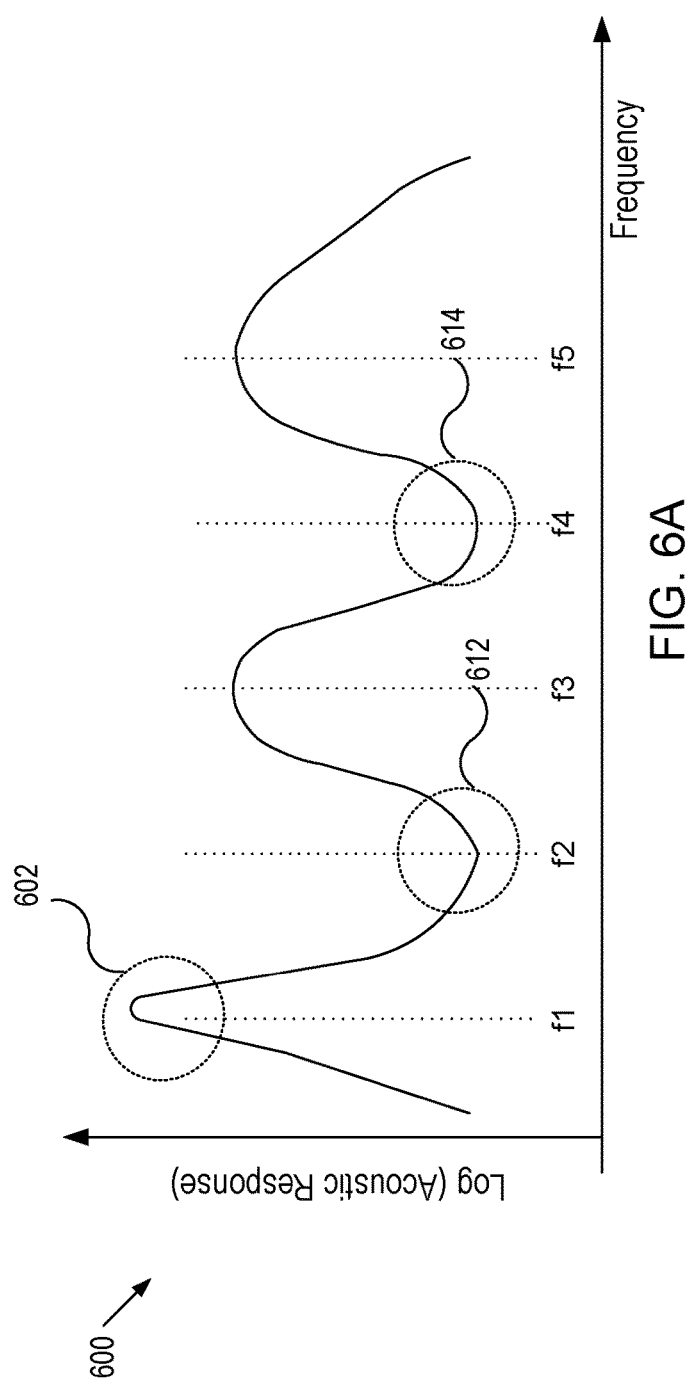
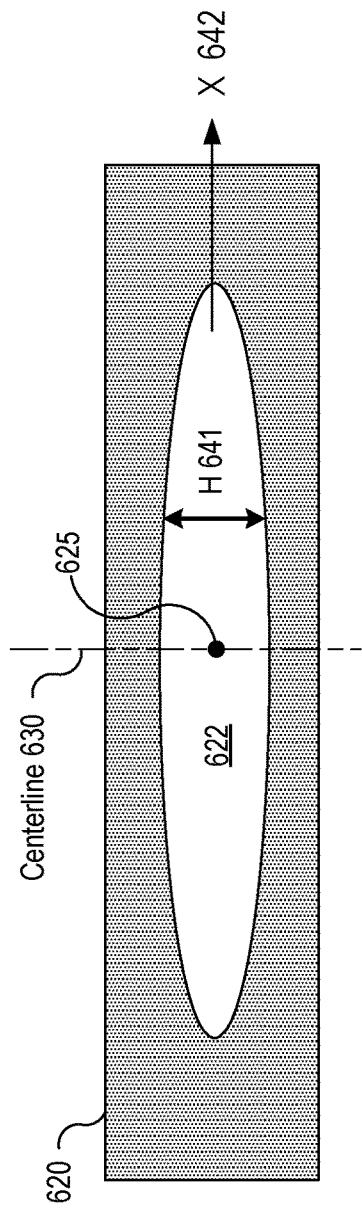
FIG. 6A
FIG. 6B

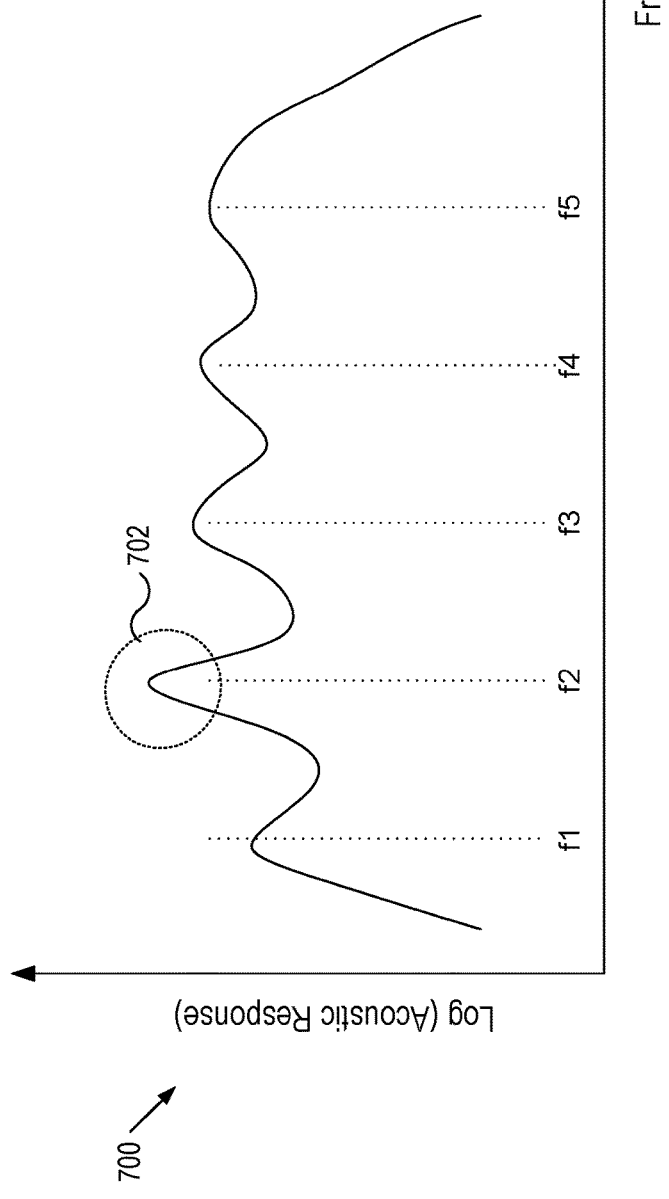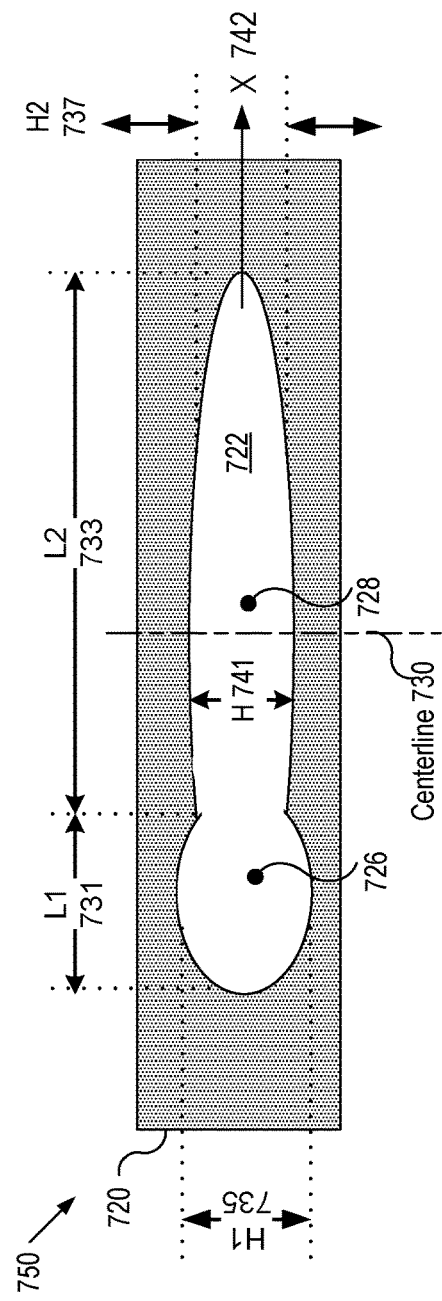

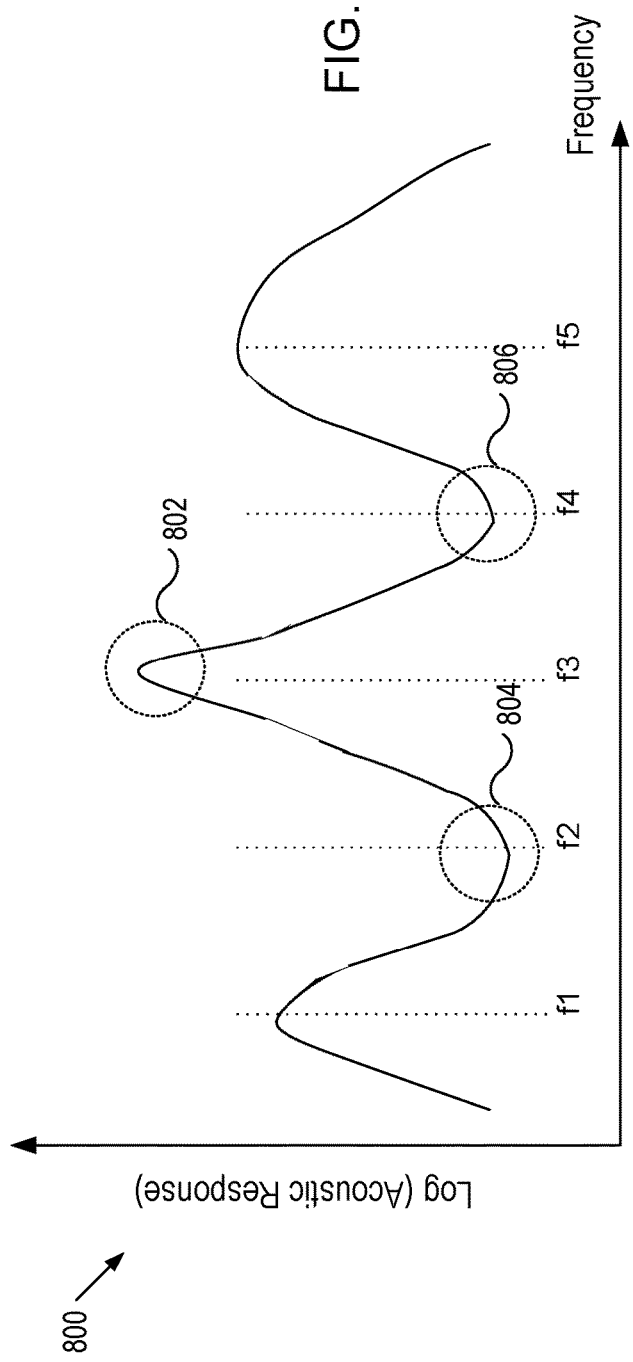
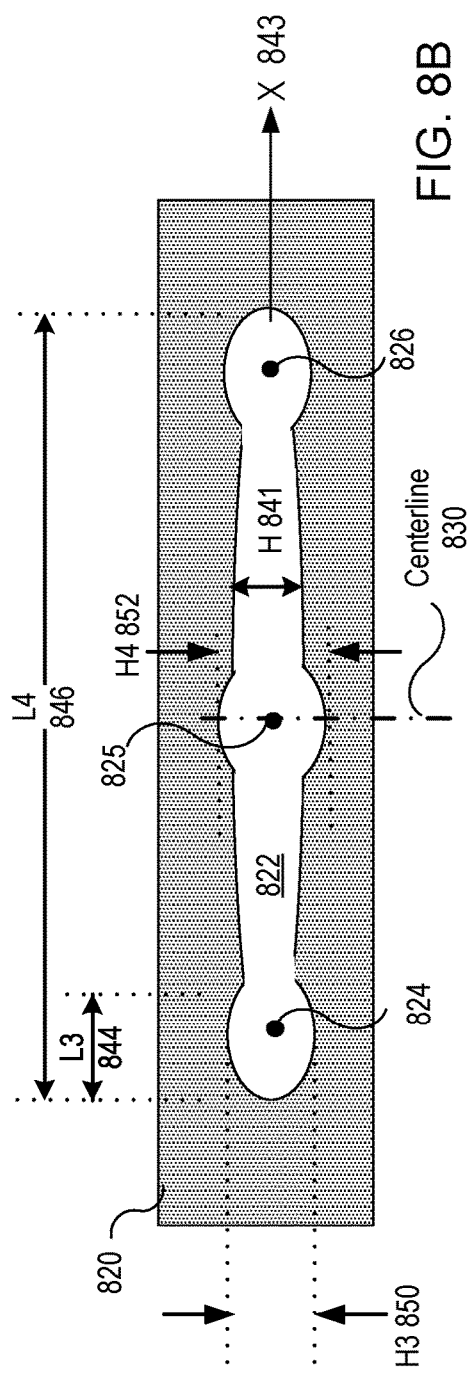
FIG. 8A
FIG. 8B

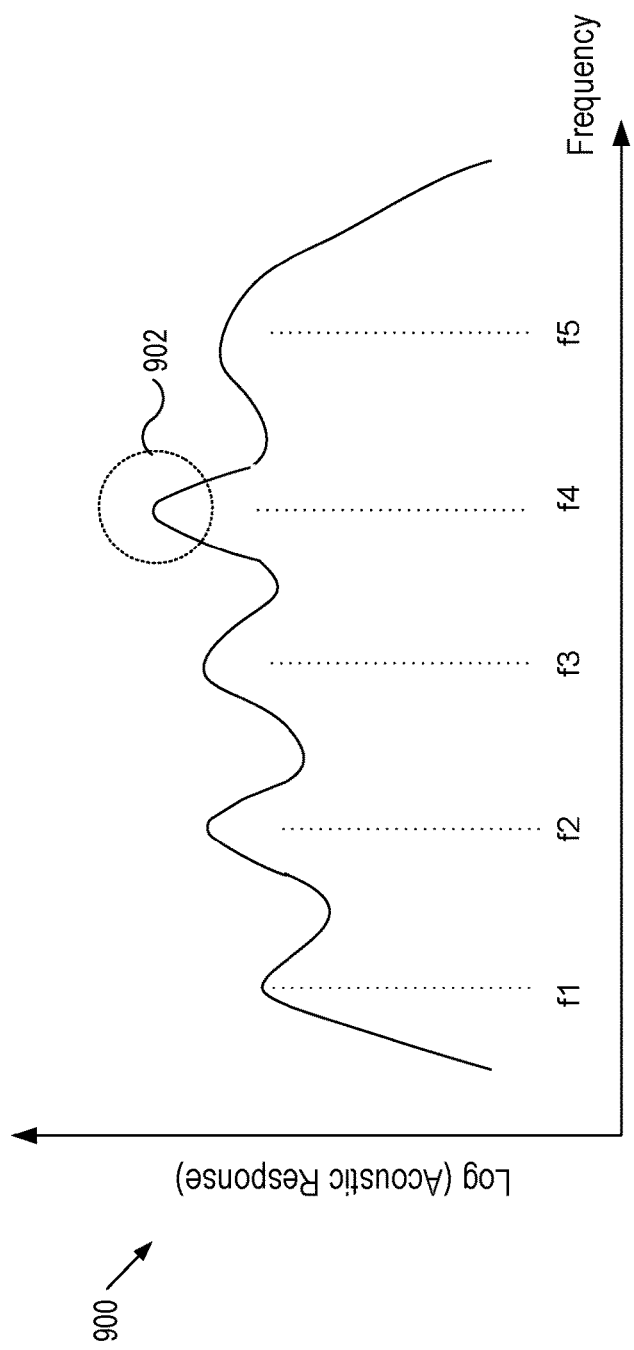
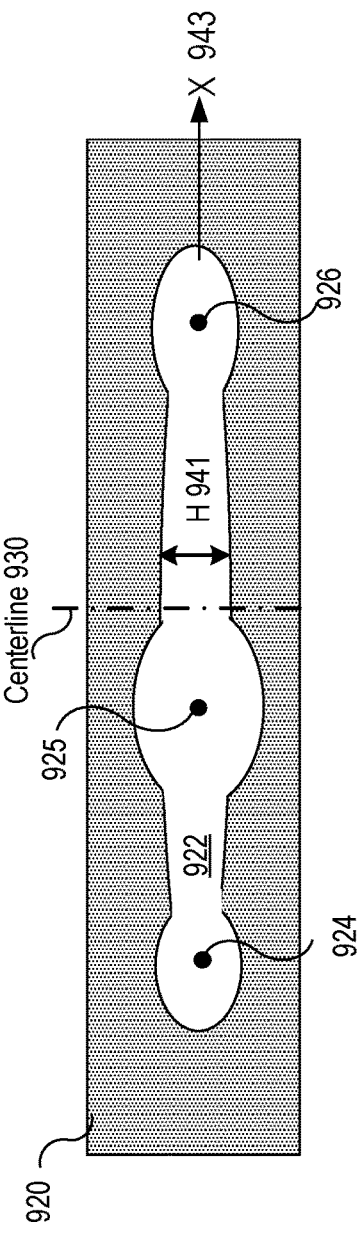
FIG. 9A
FIG. 9B

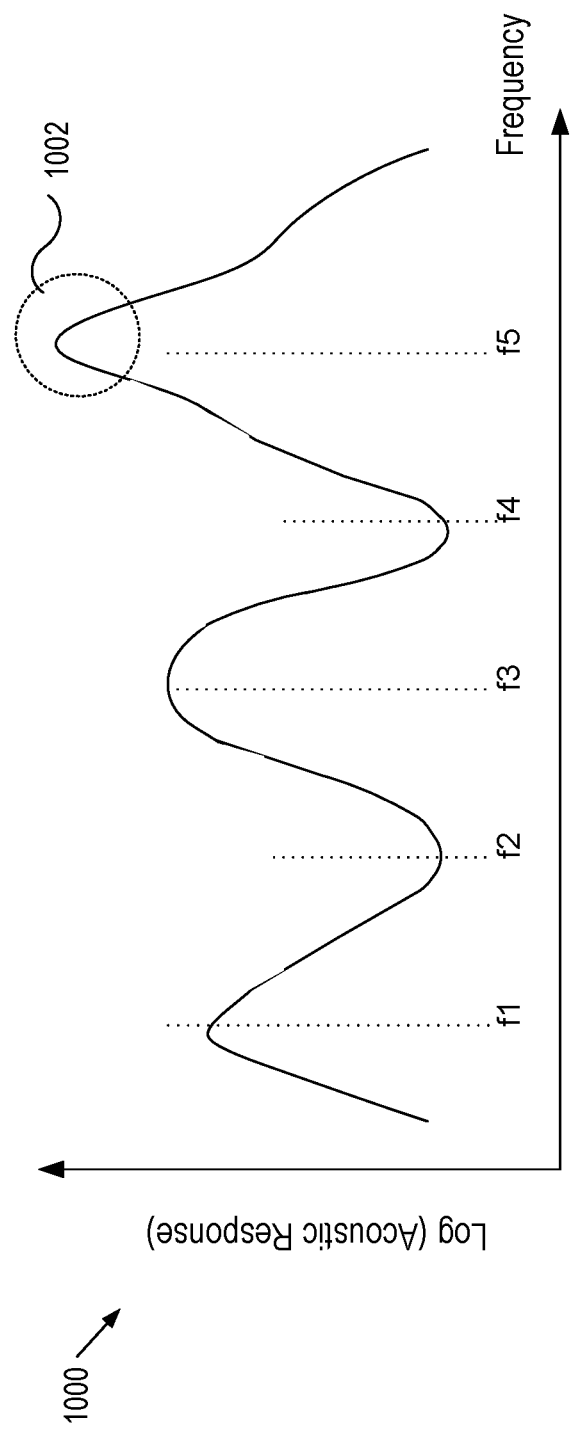

IMAGING DEVICES HAVING PIEZOELECTRIC TRANSCEIVERS

BACKGROUND

A. Technical Field

The present invention relates to imaging devices, and more particularly, to imaging devices having micromachined ultrasound transducers (MUTs).

B. Background of the Invention

A non-intrusive imaging system for imaging internal organs of a human body and displaying images of the internal organs transmits signals into the human body and receives signals reflected from the organs. Typically, transducers, such as capacitive transduction (cMUTs) or piezoelectric transduction (pMUTs), that are used in an imaging system are referred to as transceivers and some of the transceivers are based on photo-acoustic or ultrasonic effects.

In general, a MUT includes two or more electrodes and the topology of the electrodes affects both electrical and acoustic performances of the MUT. For instance, the amplitude of acoustic pressure generated by a pMUT increases as the size of the electrodes increase, to thereby improve the acoustic performance of the pMUT. However, as the size of the electrodes increases, the capacitance also increases to degrade the electrical performance of the pMUT. In another example, the amplitude of acoustic pressure at a vibrational resonance frequency of the pMUT is affected by the shape of the electrodes. As such, there is a need for methods for designing electrodes to enhance both acoustical and electrical performances of the transducers.

SUMMARY OF THE DISCLOSURE

In embodiments, a micromachined ultrasonic transducer (MUT) includes an asymmetric top electrode. The areal density distribution of the asymmetric electrode along an axis has a plurality of local maxima, wherein locations of the plurality of local maxima coincide with locations where a plurality of anti-nodal points at a vibrational resonance frequency are located.

In embodiments, a micromachined ultrasonic transducer (MUT) includes a symmetric top electrode. The areal density distribution of the symmetric electrode along an axis has a plurality of local maxima, wherein locations of the plurality of local maxima coincide with locations where a plurality of anti-nodal points at a vibrational resonance frequency are located.

In embodiments, a transducer array includes a plurality of micromachined ultrasonic transducers (MUTs). Each of the plurality of MUTs includes an asymmetric top electrode.

In embodiments, an imaging device includes a transducer array that has a plurality of micromachined ultrasonic transducers (MUTs). Each of the plurality of MUTs includes a symmetric top electrode. The areal density distribution of the symmetric electrode along an axis has a plurality of local maxima and wherein locations of the plurality of local maxima coincide with locations where a plurality of anti-nodal points at a vibrational resonance frequency are located.

BRIEF DESCRIPTION OF THE DRAWINGS

References will be made to embodiments of the invention, examples of which may be illustrated in the accompanying figures. These figures are intended to be illustrative, not limiting. Although the invention is generally described in the context of these embodiments, it should be understood that it is not intended to limit the scope of the invention to these particular embodiments.

FIG. 6A shows a plot of acoustic response of a MUT as a function of frequency according to embodiments of the present disclosure.

FIG. 6B shows a top view a MUT according to embodiments of the present disclosure.

FIG. 7A shows a plot of acoustic response of a MUT as a function of frequency according to embodiments of the present disclosure.

FIG. 7B shows a top view a MUT according to embodiments of the present disclosure.

FIG. 8A shows a plot of acoustic response of a MUT as a function of frequency according to embodiments of the present disclosure.

FIG. 8B shows a top view a MUT according to embodiments of the present disclosure.

FIG. 9A shows a plot of acoustic response of a MUT as a function of frequency according to embodiments of the present disclosure.

FIG. 9B shows a top view a MUT according to embodiments of the present disclosure.

FIG. 10A shows a plot of acoustic response of a MUT as a function of frequency according to embodiments of the present disclosure.

FIG. 10B shows a top view a MUT according to embodiments of the present disclosure.

DETAILED DESCRIPTION OF THE PREFERRED EMBODIMENTS

In the following description, for purposes of explanation, specific details are set forth in order to provide an understanding of the disclosure. It will be apparent, however, to one skilled in the art that the disclosure can be practiced without these details. Furthermore, one skilled in the art will recognize that embodiments of the present disclosure, described below, may be implemented in a variety of ways, such as a process, an apparatus, a system, or a device.

Elements/components shown in diagrams are illustrative of exemplary embodiments of the disclosure and are meant to avoid obscuring the disclosure. Reference in the specification to "one embodiment," "preferred embodiment," "an embodiment," or "embodiments" means that a particular feature, structure, characteristic, or function described in connection with the embodiment is included in at least one embodiment of the disclosure and may be in more than one embodiment. The appearances of the phrases "in one embodiment," "in an embodiment," or "in embodiments" in various places in the specification are not necessarily all referring to the same embodiment or embodiments. The terms "include," "including," "comprise," and "comprising" shall be understood to be open terms and any lists that follow are examples and not meant to be limited to the listed items. Any headings used herein are for organizational purposes only and shall not be used to limit the scope of the description or the claims. Furthermore, the use of certain terms in various places in the specification is for illustration and should not be construed as limiting.

Figure 1:
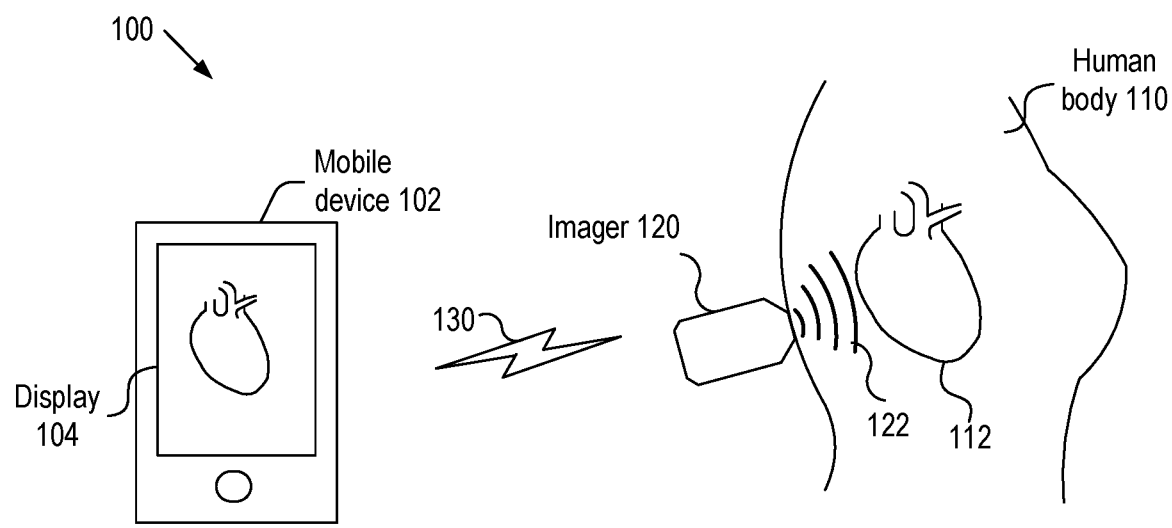
FIG. 1 shows an imaging system according to embodiments of the present disclosure.

FIG. 1 shows a schematic diagram of an imaging system 100 according to embodiments of the present disclosure. As depicted, the system 100 may include: an imager 120 that generates and transmits pressure waves 122 toward an internal organ 112, such as heart, in a transmit mode/process and receives pressure waves reflected from the internal organ; and a device 102 that sends and receives signals to the imager through a communication channel 130. In embodiments, the internal organ 112 may reflect a portion of the pressure waves 122 toward the imager 120, and the imager 120 may capture the reflected pressure waves and generate electrical signals in a receive mode/process. The imager 120 may communicate electrical signals to the device 102 and the device 102 may display images of the organ or target on a display/screen 104 using the electrical signals.

In embodiments, the imager 120 may be used to get an image of internal organs of an animal, too. The imager 120 may also be used to determine direction and velocity of blood flow in arteries and veins as in Doppler mode imaging and also measure tissue stiffness. In embodiments, the pressure wave 122 may be acoustic waves that can travel through the human/animal body and be reflected by the internal organs, tissue or arteries and veins.

In embodiments, the imager 120 may be a portable device and communicate signals through the communication channel 130, either wirelessly (using a protocol, such as 802.11 protocol) or via a cable (such as USB2, USB 3, USB 3.1, USB-C, and USB thunderbolt), with the device 102. In embodiments, the device 102 may be a mobile device, such as cell phone or iPad, or a stationary computing device that can display images to a user.

In embodiments, more than one imager may be used to develop an image of the target organ. For instance, the first imager may send the pressure waves toward the target organ while the second imager may receive the pressure waves reflected from the target organ and develop electrical charges in response to the received waves.

Figure 2:
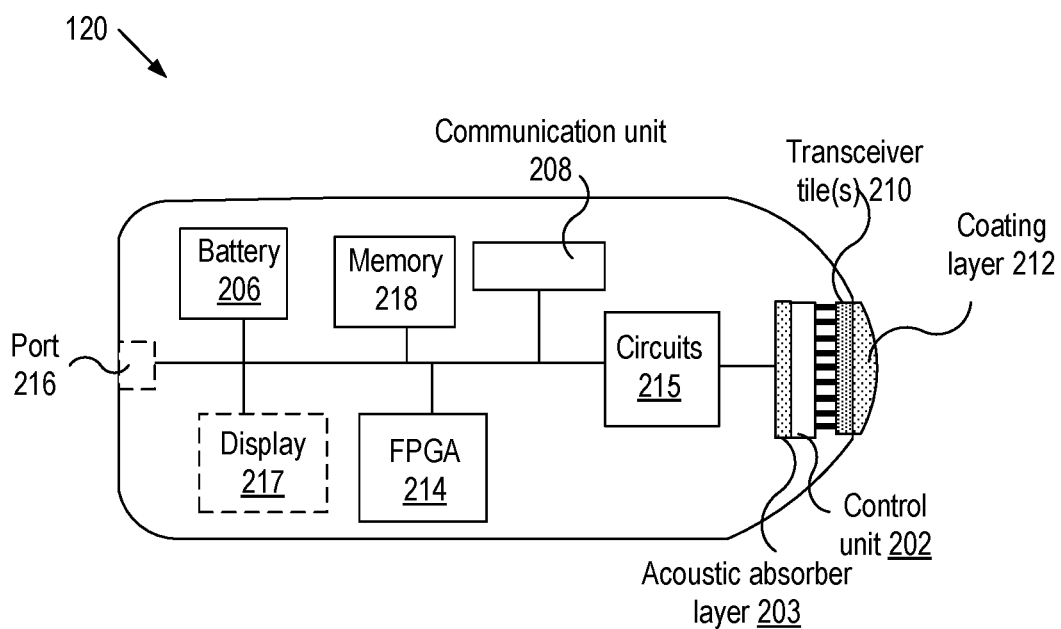
FIG. 2 shows a schematic diagram of an imager according to embodiments of the present disclosure.

FIG. 2 shows a schematic diagram of the imager 120 according to embodiments of the present disclosure. In embodiments, the imager 120 may be an ultrasonic imager. As depicted in FIG. 2, the imager 120 may include: a transceiver tile(s) 210 for transmitting and receiving pressure waves; a coating layer(s) 212 that operate as a lens for setting the propagation direction of and/or focusing the pressure waves and also functions as an acoustic impedance interface between the transceiver tile and the human body 110; a control unit 202, such as ASIC chip (or, shortly ASIC), for controlling the transceiver tile(s) 210 and coupled to the transducer tile 210 by bumps; Field Programmable Gate Arrays (FPGAs) 214 for controlling the components of the imager 120; a circuit(s) 215, such as Analogue Front End (AFE), for processing/conditioning signals; an acoustic absorber layer 203 for absorbing waves that are generated by the transducer tiles 210 and propagate toward the circuit 215; a communication unit 208 for communicating data with an external device, such as the device 102, through one or more ports 216; a memory 218 for storing data; a battery 206 for providing electrical power to the components of the imager; and optionally a display 217 for displaying images of the target organs.

In embodiments, the device 102 may have a display/screen. In such a case, the display may not be included in the imager 120. In embodiments, the imager 120 may receive electrical power from the device 102 through one of the ports 216. In such a case, the imager 120 may not include the battery 206. It is noted that one or more of the components of the imager 120 may be combined into one integral electrical element. Likewise, each component of the imager 120 may be implemented in one or more electrical elements.

In embodiments, the user may apply gel on the skin of the human body 110 before the body 110 makes a direct contact with the coating layer 212 so that the impedance matching at the interface between the coating layer 212 and the human body 110 may be improved, i.e., the loss of the pressure wave 122 at the interface is reduced and the loss of the reflected wave travelling toward the imager 120 is also reduced at the interface. In embodiments, the transceiver tiles 210 may be mounted on a substrate and may be attached to an acoustic absorber layer. This layer absorbs any ultrasonic signals that are emitted in the reverse direction, which may otherwise be reflected and interfere with the quality of the image.

As discussed below, the coating layer 212 may be only a flat matching layer just to maximize transmission of acoustic signals from the transducer to the body and vice versa. Beam focus is not required in this case, because it can be electronically implemented in control unit 202. The imager 120 may use the reflected signal to create an image of the organ 112 and results may be displayed on a screen in a variety of format, such as graphs, plots, and statistics shown with or without the images of the organ 112.

In embodiments, the control unit 202, such as ASIC, may be assembled as one unit together with the transceiver tiles. In other embodiments, the control unit 202 may be located outside the imager 120 and electrically coupled to the transceiver tile 210 via a cable. In embodiments, the imager 120 may include a housing that encloses the components 202-215 and a heat dissipation mechanism for dissipating heat energy generated by the components.

Figure 3A:
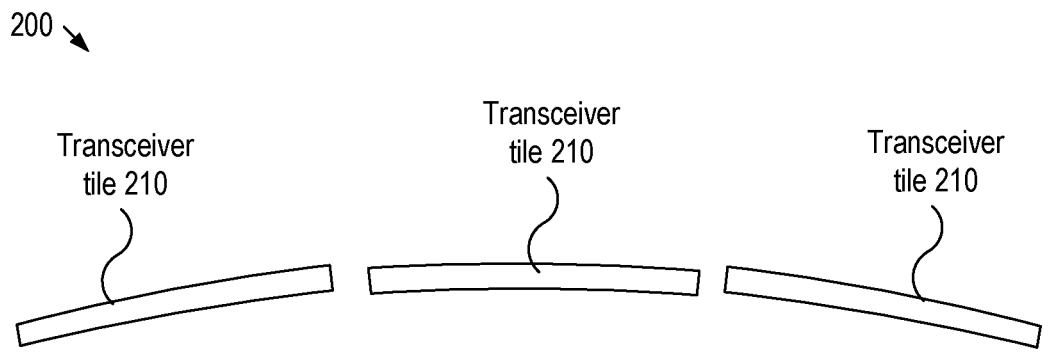
FIG. 3A shows a side view of a transceiver array according to embodiments of the present disclosure.
Figure 3B:
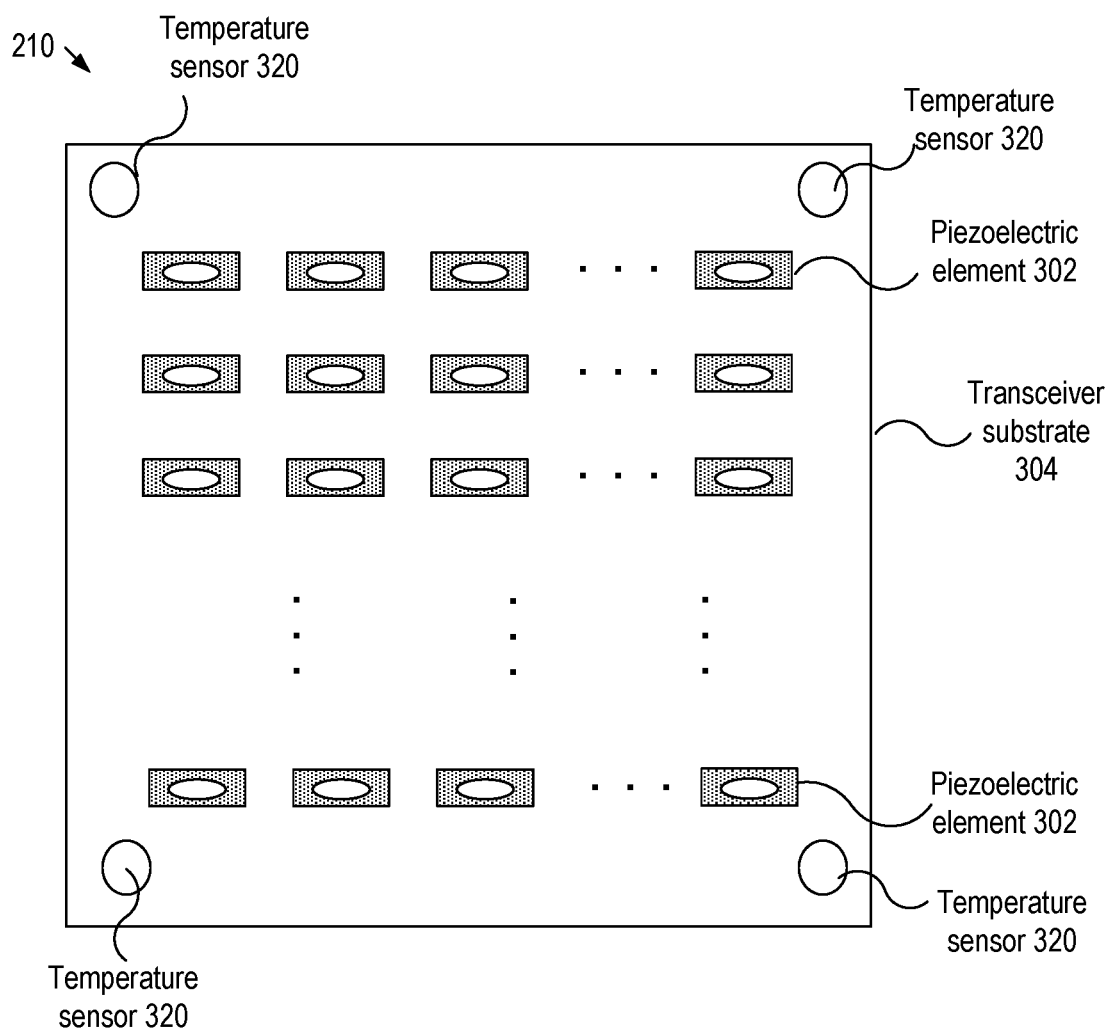
FIG. 3B shows a top view of a transceiver tile according to embodiments of the present disclosure.

FIG. 3A shows a side view of a transceiver array 200 according to embodiments of the present disclosure. FIG. 3B shows a top view of a transceiver tile 210 according to embodiments of the present disclosure. In embodiments, the array 200 may include one or more transceiver tiles 210. As depicted, the transceiver array 200 may include one or more transceiver tiles 210 arranged in a predetermined manner. For instance, as depicted in FIG. 3A, the transceiver tiles (or, shortly tiles) 210 may be physically bent to further form a curved transceiver array and disposed in the imager 120. It should be apparent to those of ordinary skill in the art that the imager 120 may include any suitable number of tiles and the tiles may be arranged in any suitable manner, and each tile 210 may include any suitable number of piezoelectric elements 302 that are disposed on a transceiver substrate 304. On the substrate 304, one or multiple number of temperature sensors 320 may be placed in order to monitor the temperature of the transceiver tile 210 during operation. In embodiments, the transceiver array 200 may be a micromachined array fabricated from a substrate.

Figure 4A:
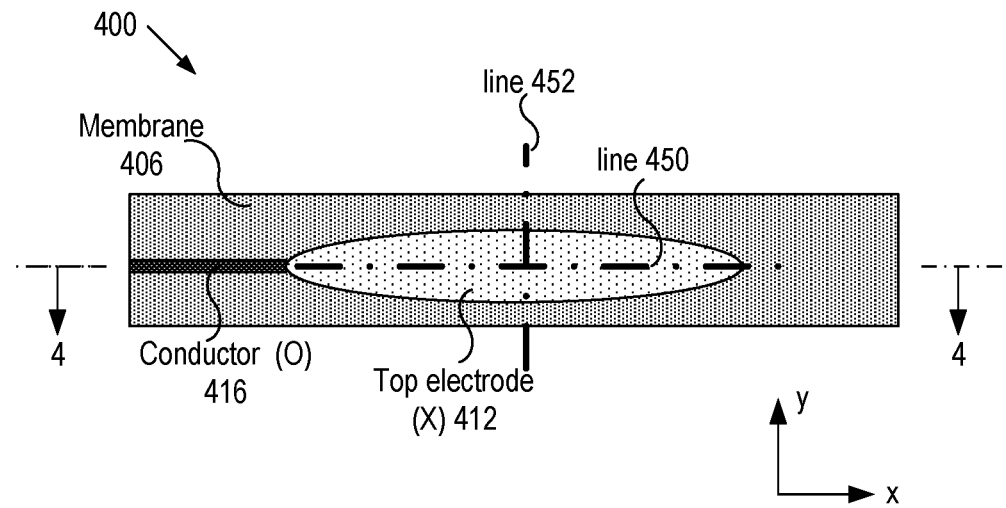
FIG. 4A shows a top view of a MUT according to embodiments of the present disclosure.
Figure 4B:
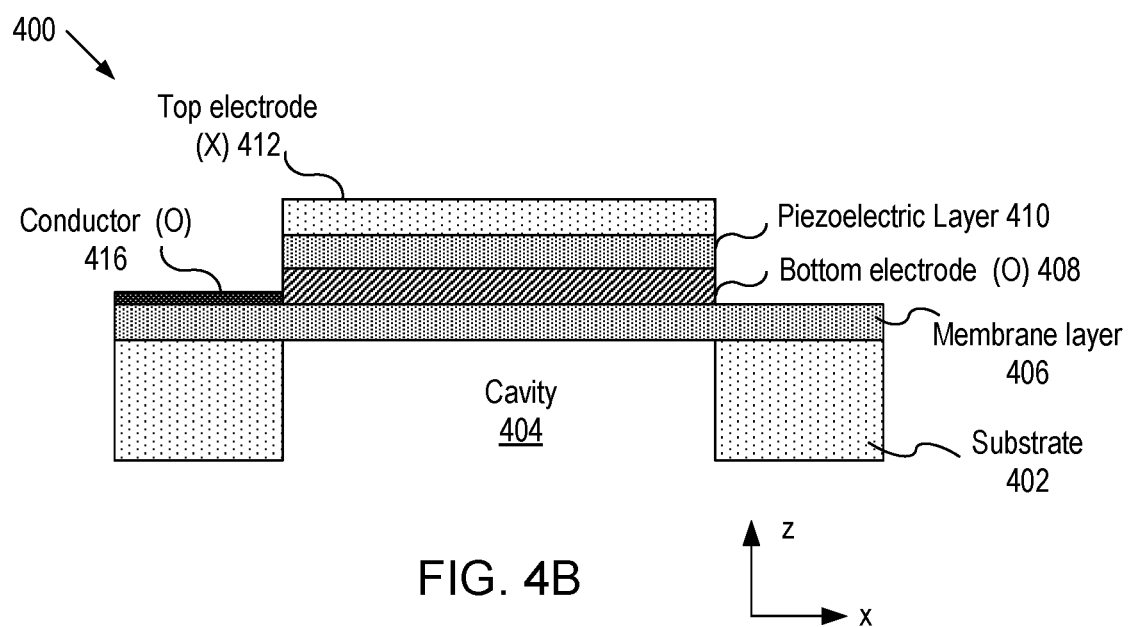
FIG. 4B shows a cross sectional view of a MUT, taken along a direction 4-4 in FIG. 4A, according to embodiments of the present disclosure.

FIG. 4A shows a top view of a MUT 400 according to embodiments of the present disclosure. FIG. 4B shows a cross-sectional view of the MUT 400 in FIG. 4A, taken along the line 4-4, according to embodiments of the present disclosure. As depicted, the MUT may include: a membrane layer 406 suspended from a substrate 402; a bottom electrode (O) 408 disposed on the membrane layer (or, shortly membrane) 406; a piezoelectric layer 410 disposed on the bottom electrode (O) 408; and a top electrode (X) 412 disposed on the piezoelectric layer 410.

In embodiments, the substrate 402 and the membrane 406 may be one monolithic body and the cavity 404 may be formed to define the membrane 406. In embodiments, the cavity 404 may be filled with a gas at a predetermined pressure or an acoustic damping material to control the vibration of the membrane 406. In embodiments, the geometrical shape of the projection area of the top electrode 412 may be configured to control the dynamic performance and capacitance magnitude of the pMUT 400.

In embodiments, each MUT 400 may by a pMUT and include a piezoelectric layer formed of at least one of PZT, KNN, PZT-N, PMN—Pt, AlN, Sc—AlN, ZnO, PVDF, and LiNiO$_3$. In alternative embodiments, each MUT 400 may be a cMUT. In FIG. 4A, each MUT 400 is shown to have a rectangular shape. In embodiments, each MUT may include a top electrode that has an elliptical shape when viewed from the top of the MUT 400. Hereinafter, the term shape of the top electrode 412 refers to a two-dimensional shape of the top electrode obtained by projecting the top electrode on to the x-y plane. Also, the shape of the top electrode is called symmetric if the shape is symmetric with respect to the two lines 450 and 452, where the lines 450 and 452 are parallel to the x- and y-axes, respectively, and pass through the midpoint of the top electrode on the x-axis. Also, hereinafter, the x-axis extends along the direction where the top electrode has the longest dimension. It should be apparent to those of ordinary skill in the art that the top electrode may have other suitable symmetric shape, such as, square, circle, rectangle, and oval, so on.

FIGS. 5A-5E show five vibrational modes 500, 510, 520, 530, and 540, according to embodiments of the present disclosure. In FIGS. 5A-5E, each of the MUTs 502, 512, 522, 532, and 542 is represented by a single line for the purpose of illustration, where each single line shows the curvature of the stack of layers in a MUT. During operation, the stack of layers having the membrane 406, bottom electrode 408, piezoelectric layer 410, and top electrode 412 may move as a single body in the vertical direction, and may be deformed to have the curvature of the single line on the x-z plane. Also, the lines 502, 512, 522, 532, and 542 that correspond to different vibrational modes show the curvatures of the stack at different vibrational modes.

In embodiments, the five vibrational modes 500, 510, 520, 530, and 540 may be associated with five vibrational resonance frequencies, f1, f2, f3, f4, and f5, respectively. In FIGS. 5A-5E, only five vibrational modes are shown. However, it should be apparent to those of ordinary skill in the art that a MUT may operate in more than five vibrational resonance modes (or shortly vibrational modes).

Figure 5A:
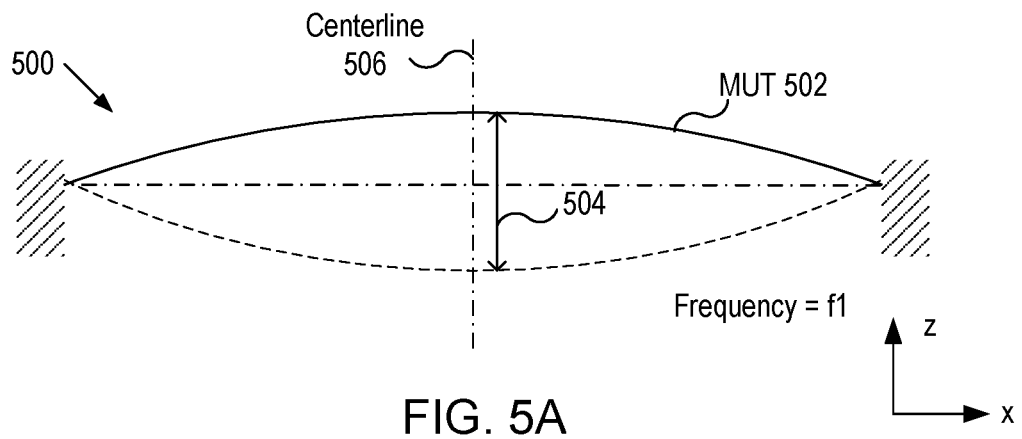
FIGS. 5A-5E show vibrational mode shapes of MUTs according to embodiments of the present disclosure.

In FIG. 5A, the MUT 502 may operate in the first vibrational mode 500, where the arrow 504 indicates that the MUT 502 (more specifically, the stack of layers) moves in the vertical direction in the first mode 500. In embodiments, the first vibrational mode 500 may be symmetric, i.e., the mode shape is symmetric with respect to the centerline 506 of the MUT. In embodiments, the shape of the top electrode of the MUT 502 may be symmetric and similar to the shape of the top electrode 412.

Figure 5B:
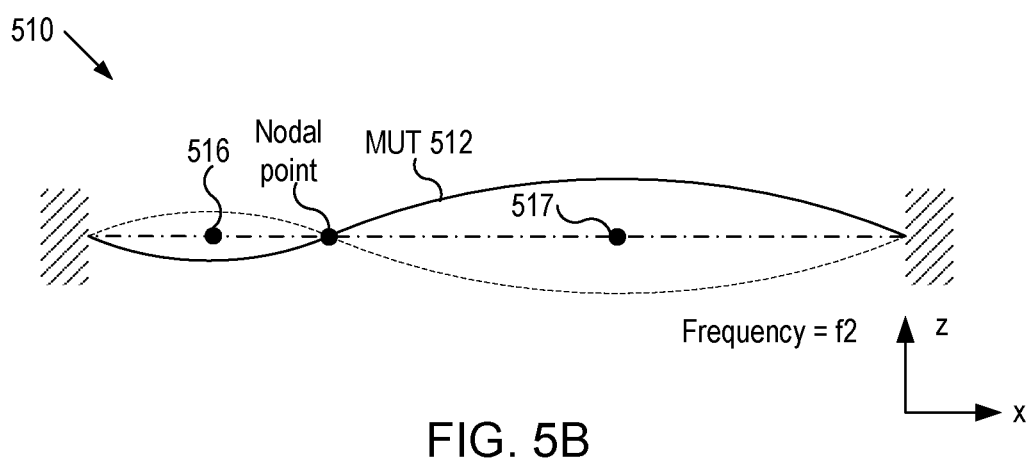
Figure 5C:
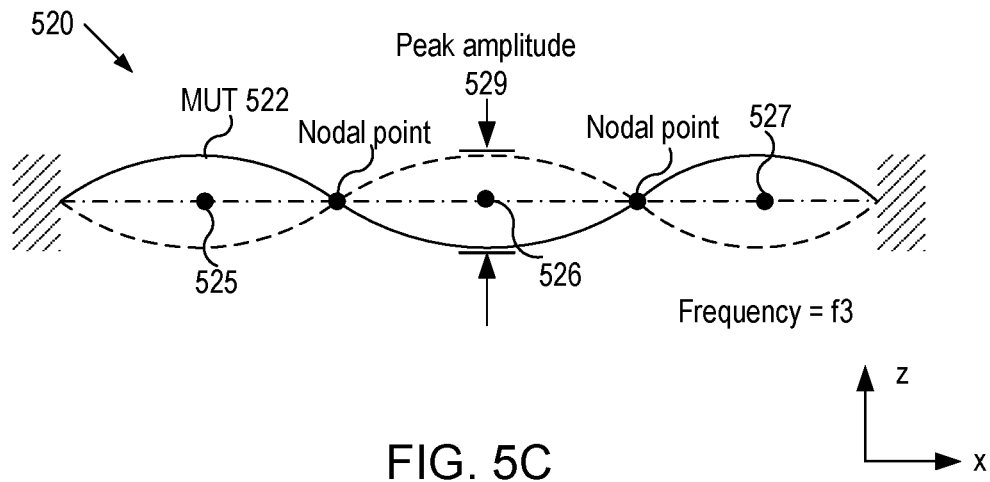

In FIG. 5C, the MUT 522 may operate in the third vibrational mode 520. In embodiments, the third vibrational mode 520 may be symmetric, i.e., the mode shape is symmetric with respect to the centerline 506. Hereinafter, the term symmetric vibrational mode refers to a vibrational mode where the locations of the anti-nodal points, such as 525, 526, and 527, (i.e., the peak amplitudes) are arranged symmetrically with respect to a centerline 506, and the centerline 506 represents a line that is parallel to the z-axis and passes through the midpoint of the MUT on the x-axis. Likewise, the term asymmetric vibrational mode refers to a vibrational mode where the locations of the anti-nodal points, such as 516 and 517 in FIG. 5B, are arranged asymmetrically with respect to the centerline 506.

In the third vibrational mode 520, the MUT 522 may have two nodal points and three anti-nodal points (or equivalently, three peak amplitude points) 525, 526, and 527. In embodiments, the shape of the top electrode of the MUT 522 may be symmetric and similar to the shape of the top electrode 412.

Figure 5D:
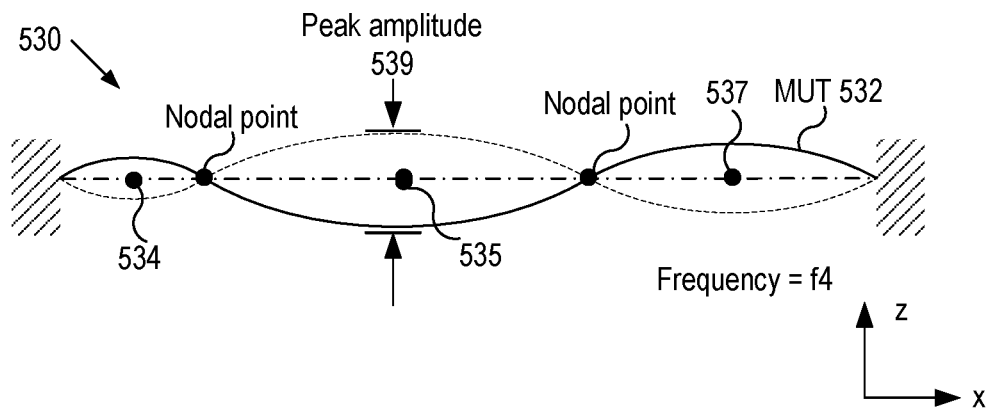
Figure 5E:
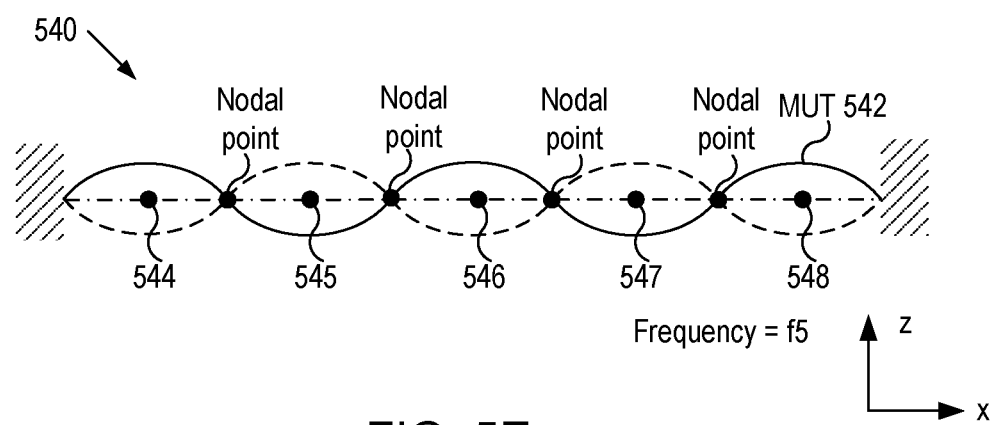

In FIG. 5E, the MUT 542 may operate in the fifth vibrational mode 540. In embodiments, the fifth vibrational mode 540 may be symmetric, i.e., the mode shape is symmetric with respect to the centerline 506. In the fifth vibrational mode, the MUT 542 may have four nodal points and five anti-nodal points (i.e. five peak amplitude points) 544, 545, 546, 547, and 548. In embodiments, the shape of the top electrode of the MUT 542 may be symmetric and similar to the shape of the top electrode 412.

In embodiments, if the top electrode has a symmetric shape, the MUTs may operate in the symmetric vibrational modes 500, 520 and 540. In embodiments, the geometrical shape of the top electrode may be changed so that the MUT may vibrate in one or more asymmetric vibrational modes as well as symmetric vibrational modes. In FIG. 5B, the MUT 512 may operate in an asymmetric second vibrational mode 510. In the asymmetric second vibrational mode, the MUT 512 may have one nodal point and two anti-nodal points (or equivalently, two peak amplitude points) 516 and 517. The shape of the top electrode corresponding to the MUT 512 is described in conjunction with FIGS. 7A-7C.

In FIG. 5D, the MUT 532 may operate in an asymmetric third vibrational mode 530. As depicted, the vibrational mode 530 may be asymmetric with respect to the centerline 506. In the asymmetric third vibrational mode, the MUT 532 may have two nodal points and three anti-nodal points (or equivalently, three peak amplitude points) 534, 535, and 537. In embodiments, the peak amplitude 539 of the asymmetric third vibrational mode 530 may be higher than the peal amplitude 529 of the symmetric third vibrational mode 520. In general, an asymmetric vibrational mode (such as 530) may have higher peak amplitude than a symmetric vibrational mode of the same order (such as 520).

In general, the acoustic pressure performance, which refers to the energy of an acoustic pressure wave generated by each MUT at a frequency, may increase as the peak amplitude of the MUT increases at the frequency. As depicted in FIGS. 5C and 5D, an asymmetric vibrational mode may have higher peak amplitude than a symmetric vibrational mode of the same order. As such, a MUT operating in an asymmetric vibrational mode may yield higher acoustic pressure performance than a MUT operating in a symmetric vibrational mode of the same order. Also, the frequency of a symmetric vibrational mode may be different from the frequency of an asymmetric vibration mode of the same order. As such, in embodiments, the vibrational resonance frequency of each MUT can be tuned by switching from symmetric mode to asymmetric mode of the same order (or vice versa).

Figure 6C:
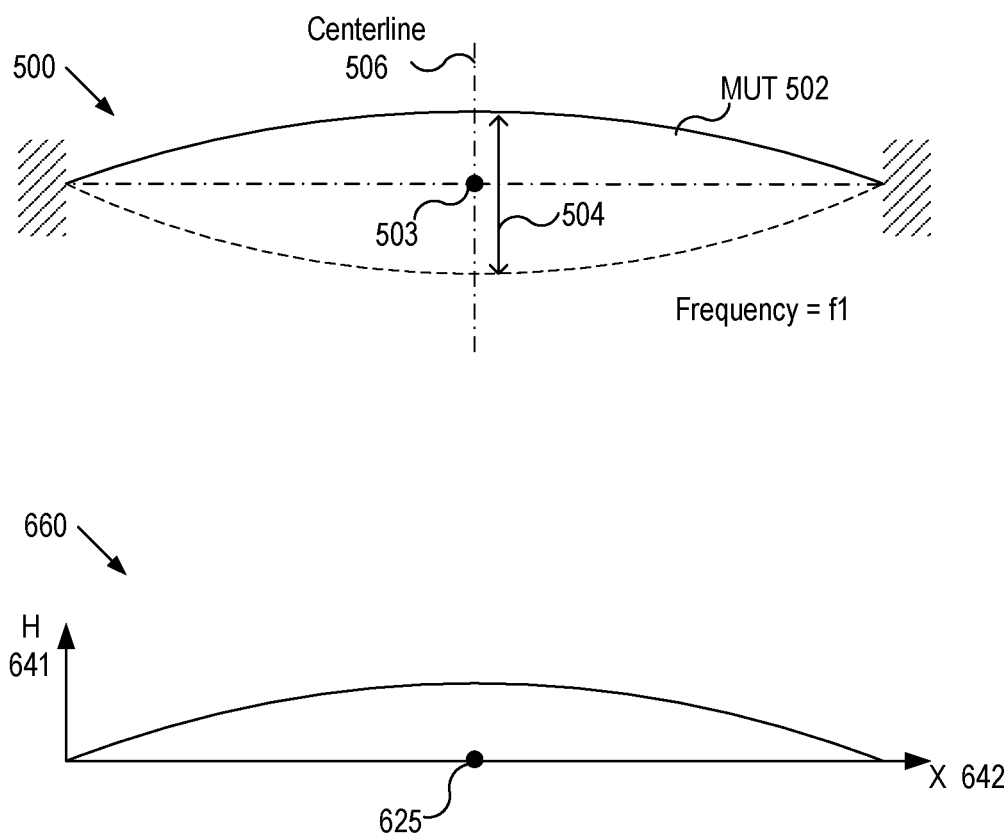
FIG. 6C shows an areal density distribution of a top electrode according to embodiments of the present disclosure.

FIG. 6A shows a plot 600 of acoustic response of a MUT 620 having a top electrode 622 according to embodiments of the present disclosure. FIG. 6B shows a top view of the MUT 620 according to embodiments of the present disclosure. In FIG. 6B, the height, H 641 represents the vertical dimension of the top electrode, and FIG. 6C shows a distribution 660 of the height H 641 (i.e. areal density distribution) along the x-axis 642 according to embodiments of the present disclosure. For the purpose of illustration, the vibrational mode 500 in FIG. 5A is shown over the plot 660. As depicted, the projection area of the top electrode 622 has an elliptical shape, where the elliptical shape is symmetric with respect to both the centerline 630 and the x-axis 642, i.e., the shape of the top electrode is symmetric. As such, the MUT 620 may have strong acoustic response at the symmetric vibrational modes f1, f3 and f5. Also, the MUT 620 may have very weak acoustic response at the asymmetric vibrational modes 510 (f2) and 530 (f4), as indicated by the circles 612 and 614.

In embodiments, the location 625 where the height H 641 is maximum is the same as the location 503 where the anti-nodal point (i.e. peak amplitude) of the vibrational mode 500 occurs. As a consequence, the MUT 620 may have strongest acoustic response at the frequency f1, as indicated by the circle 602, where f1 corresponds to the first symmetric vibrational mode (500).

Figure 7C:
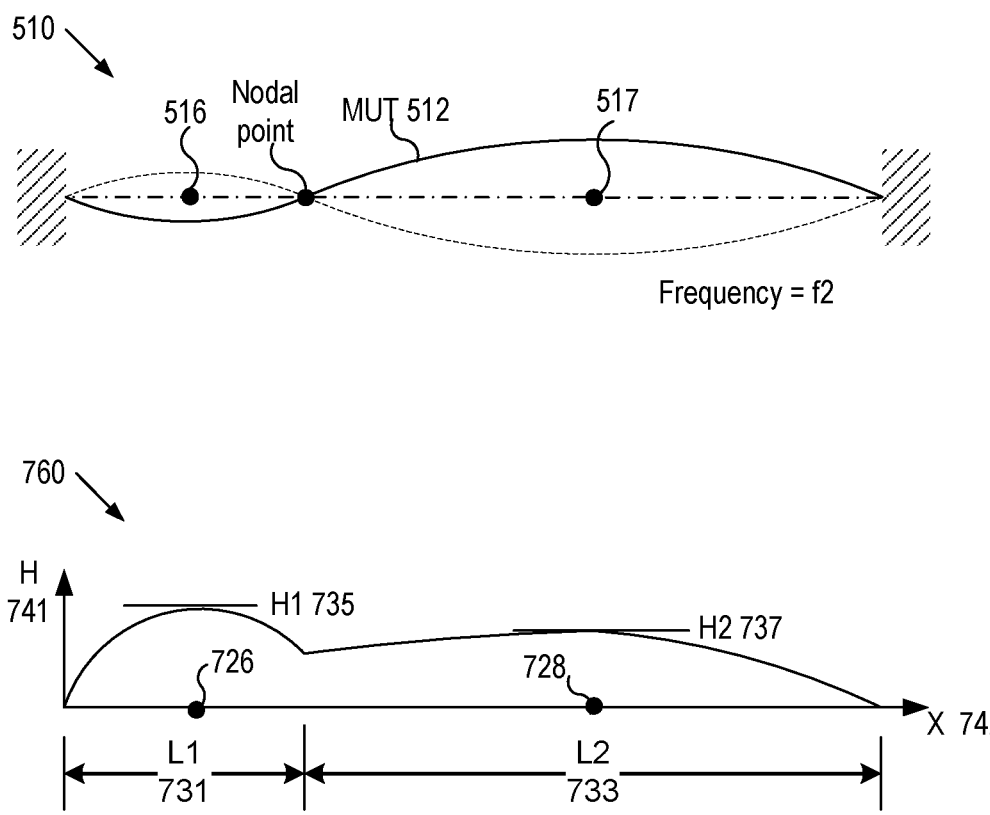
FIG. 7C shows an areal density distribution of a top electrode according to embodiments of the present disclosure.

FIG. 7A shows a plot 700 of acoustic response of a MUT 720 having a top electrode 722 according to embodiments of the present disclosure. FIG. 7B shows a top view of the MUT 720 according to embodiments of the present disclosure. In FIG. 7B, the height, H 741 represents the vertical dimension of the top electrode. FIG. 7C shows a distribution 760 of the height H 741 (or, equivalently areal density distribution) along the x-axis 742 according to embodiments of the present disclosure. For the purpose of illustration, the vibrational mode 510 in FIG. 5B is shown over the areal distribution plot 760. As discussed above, the terms height and areal density are used interchangeably since the height distribution 760 may represent the distribution of the areal density of the top electrode 722 along the x-axis 742.

As depicted in FIG. 7B, the shape of the top electrode 722 may be asymmetric since the top electrode 722 is not symmetric with respect to the centerline 730 that passes through the midpoint of the top electrode on the x-axis. As a consequence, the MUT 720 may operate in both symmetric vibrational modes (f1, f3, and f5) and asymmetric vibrational modes (f2 and f4). In embodiments, the locations 726 and 728 of the local maxima H1 735 and H2 737 of the areal density distribution 760 coincide with the anti-nodal points 516 and 517 of the vibrational mode 510, respectively. As a consequence, the MUT 720 may have the strongest acoustic response at the frequency f2, as indicated by a circle 702.

In embodiments, the ratio of L2 733 to L1 731 may be adjusted to control the locations 726 and 728 of the local maxima of the areal density distribution. For instance, the ratio of L2 733 to L1 731 may be greater than 1.05. In embodiments, the ratio of H1 735 to H2 737 may be adjusted to control the acoustic response at the frequency f2. For instance, the ratio of heights H1 735 to H2 737 may be greater than 1.05.

In embodiments, the distribution of areal density 760 of the top electrode 722 may affect the acoustic response of the MUT 720. As described in conjunction with FIGS. 9A-9C, the areal density distribution of the top electrode 722 may be modified so that the acoustic response has the maximum value at the frequency f4.

Figure 8C:
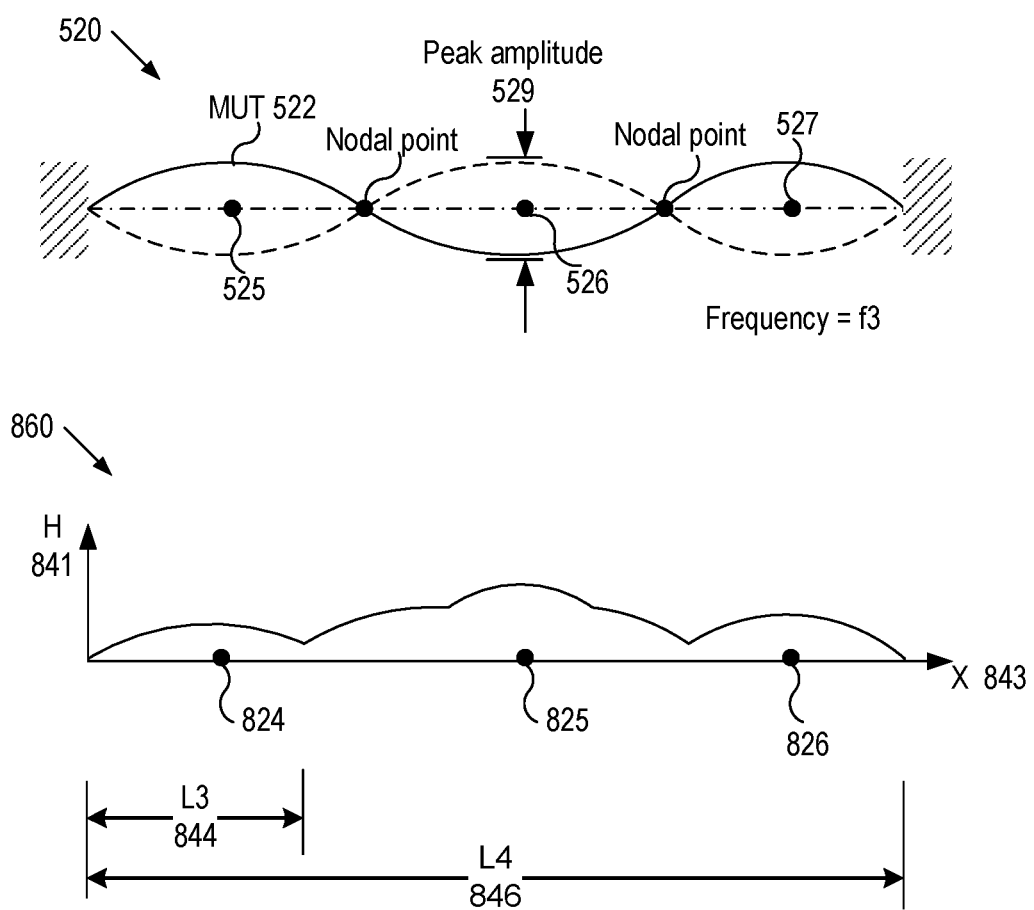
FIG. 8C shows an areal density distribution of a top electrode according to embodiments of the present disclosure.

FIG. 8A shows a plot 800 of acoustic response of a MUT 820 having a top electrode 822 according to embodiments of the present disclosure. FIG. 8B shows a top view of the MUT 820 according to embodiments of the present disclosure. FIG. 8C shows the distribution 860 of the height H 841 (or, equivalently distribution of areal density) of the top electrode 822 along the x-axis 843. For the purpose of illustration, the symmetric vibrational mode 520 in FIG. 5C is also shown over the plot 860. As depicted, the top electrode 822 may be symmetric since it is symmetric with respect to both the x-axis 843 and the centerline 830, and as a consequence, the MUT 820 may have strong acoustic response at the symmetric vibrational modes (f1, f3, and f5), and very weak acoustic response at the asymmetric vibrational modes (f2 and f4) as indicated by circles 804 and 806.

As depicted, the areal density distribution 860 may have local maxima at three locations 824, 825, and 826. Also, these three locations 824, 825, and 826 respectively coincide with the locations 525, 526, and 527 where the anti-nodal points of the third symmetric vibrational mode 520 are located. As a consequence, the MUT 820 may have the strongest acoustic response at the frequency f3, as indicated by the circle 802.

In embodiments, the ratio of L3 844 to L4 846 may be adjusted to control the location 824 of the local maximum of the areal density distribution. For instance, the ratio of the ratio of L4 846 to L3 844 may be equal to and greater than 10. In embodiments, the ratio of H3 850 to H4 852 may be adjusted to control the acoustic response at the frequency f2. For instance, the ratio of H4 852 to H3 850 may be equal to or greater than 1.05.

Figure 9C:
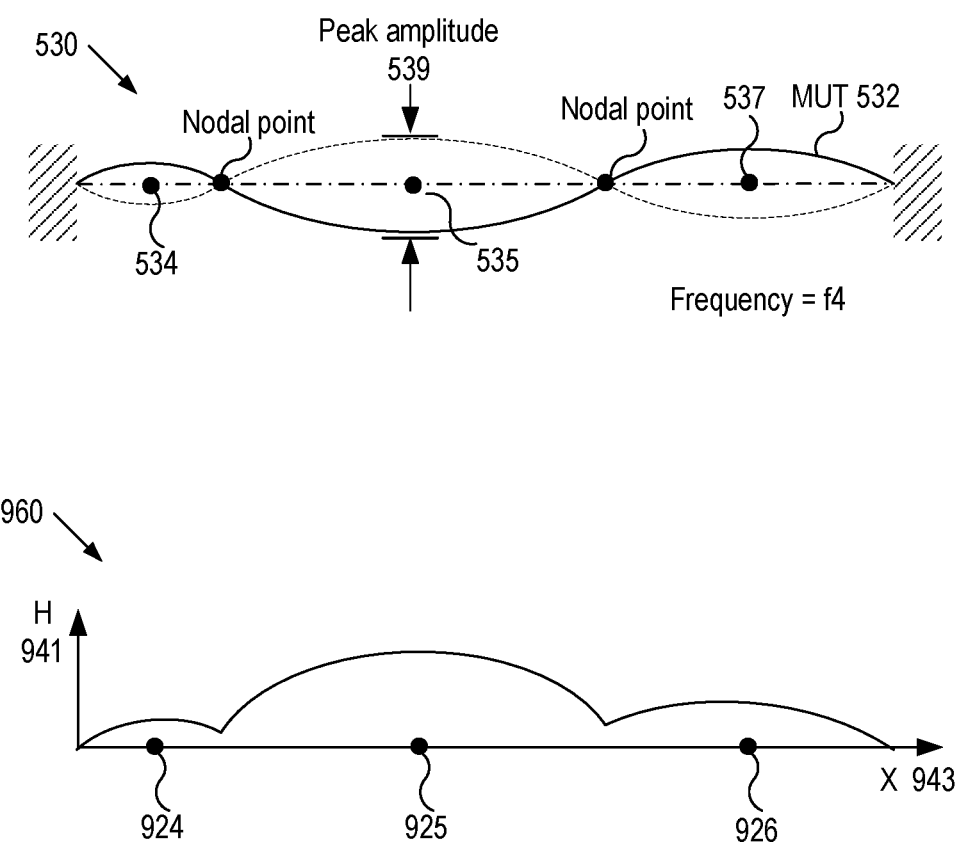
FIG. 9C shows an areal density distribution of a top electrode according to embodiments of the present disclosure.

FIG. 9A shows a plot 900 of acoustic response of a MUT 920 having a top electrode 922 according to embodiments of the present disclosure. FIG. 9B shows a top view of the MUT 920 according to embodiments of the present disclosure. FIG. 9C shows the distribution 960 of the height H 941 along the x-axis 943. For the purpose of illustration, the asymmetric vibrational mode 530 in FIG. 5D is also shown over the height (or areal density) distribution plot 960. As depicted, the top electrode 922 may be asymmetric with respect to the centerline 930, and as a consequence, the MUT 920 may have both the symmetric vibrational modes (f1, f3, and f5) and the asymmetric vibrational modes (f2 and f4). Also, in embodiments, the acoustic response may be strongest at the asymmetric vibrational frequency f4 (530), as indicated by a circle 902.

In embodiments, the areal density distribution 960 may have local maxima at three locations 924, 925, and 926. Also, these three locations 924, 925, and 926 may coincide with the locations 534, 535, and 537 where the anti-nodal points of the vibrational mode 530 are located. As a consequence, the MUT 920 may have the strongest acoustic response at the frequency f4, as indicated by a circle 902.

Figure 10C:
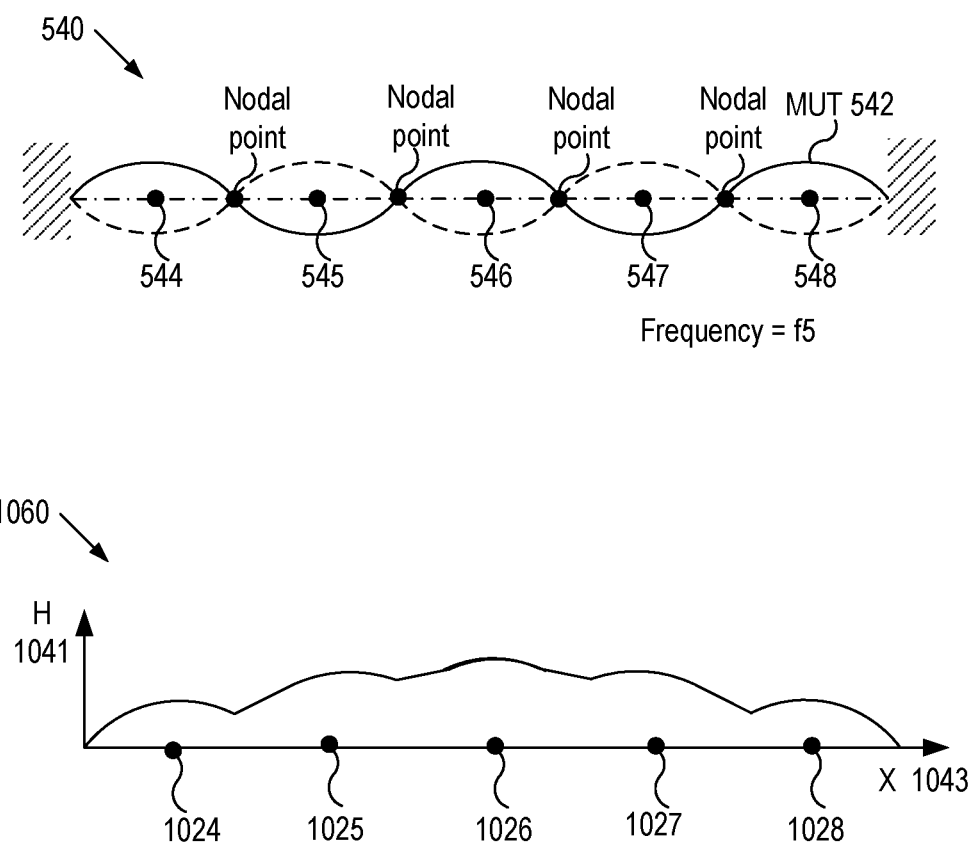
FIG. 10C shows an areal density distribution of a top electrode according to embodiments of the present disclosure.

FIG. 10A shows a plot 1000 of acoustic response of a MUT 1020 having a top electrode 1022 according to embodiments of the present disclosure. FIG. 10B shows a top view of the MUT 1020 according to embodiments of the present disclosure. FIG. 10C shows the distribution 1060 of the height H 1041 along the x-axis 1043. For the purpose of illustration, the symmetric vibrational mode 540 in FIG. 5E is also shown over the plot 1060. As depicted, the top electrode 1022 may be symmetric since it is symmetric with respect to both the x-axis 1043 and the centerline 1030, and as a consequence, the MUT 1020 may have strong acoustic response at the symmetric vibrational modes (f1, f3, and f5) and very weak acoustic response at the asymmetric vibrational modes (f2 and f4). Also, the acoustic response is the strongest at the fifth symmetric vibrational mode f5, as indicated by a circle 1002.

In embodiments, the areal density distribution 1060 may have local maxima at five locations 1024, 1025, 1026, 1027, and 1028. Also, these five locations 1024, 1025, 1026, 1027, and 1028 may coincide with the locations 544, 545, 546, 547, and 548 where the peak amplitudes of the vibrational mode 540 are located. As a consequence, the MUT 1020 may have the strongest acoustic response at the frequency f5.

In embodiments, as described in conjunction with FIGS. 6A-10C, a symmetric top electrode may have strong acoustic response at symmetric vibrational modes and very weak acoustic response at asymmetric vibrational modes. Also, in embodiments, an asymmetric top electrode may have strong acoustic response at both symmetric and asymmetric vibrational modes. In embodiments, to increase the acoustic response at a vibrational mode, the areal density distribution of the top electrode may be adjusted so that the local maxima (or maximum) of the areal density distribution are (is) located at the locations(s) where the anti-nodal point(s) of the vibrational mode(s) are (is) located.

For the purpose of illustration, only five vibrational modes f1-f5 are shown in FIGS. 6A-10C. However, it should be apparent to those of ordinary skill in the art that a MUT may have more than five vibrational modes. Also, it should be apparent to those of ordinary skill in the art that the areal density distribution may be adjusted to control the magnitude of the acoustic response at the higher vibrational modes in the similar manner as described in FIGS. 6A-10C.

It is noted that each of the MUTs 302 in FIG. 3B may be a piezoelectric micromachined ultrasound transducer (pMUT). However, it should be apparent to those of ordinary skill in the art that the transceiver tile 210 may include an array of capacitive micromachined ultrasound transducers (cMUTs), i.e., the piezoelectric elements 302 may be replaced by cMUTs. In such a case, the top electrode of a CMUT may have a shape that is similar to one of shapes of the top electrodes 622, 722, 822, 922, and 1022, so that the acoustic response of the cMUT is controlled at various vibrational resonance frequencies, based on the principles described in conjunction with FIGS. 6A-10C.

While the invention is susceptible to various modifications and alternative forms, specific examples thereof have been shown in the drawings and are herein described in detail. It should be understood, however, that the invention is not to be limited to the particular forms disclosed, but to the contrary, the invention is to cover all modifications, equivalents, and alternatives falling within the scope of the appended claims.

What is claimed is:

1. A micromachined ultrasonic transducer (MUT), comprising: an electrode that is symmetric with respect to a first axis and asymmetric with respect to a second axis that is normal to the first axis, the first axis extending along a direction where the electrode has a longest dimension, the second axis passing through a midpoint between two ends of the electrode on the first axis, wherein an areal density distribution of the electrode along an axis has a plurality of local maxima, and wherein locations of the plurality of local maxima coincide with locations where a plurality of anti-nodal points at a vibrational resonance frequency are located.

2. The MUT of claim 1, wherein the MUT is a capacitive micromachined ultrasound transducer (cMUT).

3. The MUT of claim 1, wherein the MUT is a piezoelectric micromachined ultrasound transducer (pMUT).

4. The MUT of claim 3, further comprising:
a substrate;
a membrane suspending from the substrate;
a bottom electrode disposed on the membrane; and
a piezoelectric layer disposed on the bottom electrode;
wherein the electrode is disposed on the piezoelectric layer.

5. The MUT of claim 4, wherein the piezoelectric layer is formed of at least one of PZT, KNN, PZT-N, PMN—Pt, AlN, Sc—AlN, ZnO, PVDF, and LiNiO$_3$.

6. A micromachined ultrasonic transducer (MUT), comprising:
a symmetric electrode,
wherein an areal density distribution of the symmetric electrode along an axis has a plurality of local maxima and wherein locations of the plurality of local maxima coincide with locations where a plurality of anti-nodal points at a vibrational resonance frequency are located.

7. The MUT of claim 6, wherein the axis extends along a direction where the symmetric electrode has a longest dimension.

8. The MUT of claim 6, wherein the vibrational resonance frequency has a symmetric vibrational mode.

9. The MUT of claim 6, wherein the MUT is a capacitive micromachined ultrasound transducer (cMUT).

10. The MUT of claim 6, wherein the MUT is a piezoelectric micromachined ultrasound transducer (pMUT).

11. The MUT of claim 10, further comprising:
a substrate;
a membrane suspending from the substrate;
a bottom electrode disposed on the membrane;
a piezoelectric layer disposed on the bottom electrode; and
a top electrode disposed on the piezoelectric layer, wherein the top electrode is the symmetric electrode.

12. The MUT of claim 11, wherein the piezoelectric layer is formed of at least one of PZT, KNN, PZT-N, PMN—Pt, AlN, Sc—AlN, ZnO, PVDF, and LiNiO$_3$.

13. An imaging device, comprising:
a transducer array including a plurality of micromachined ultrasonic transducers (MUTs),
each of the plurality of MUTs comprising:
an electrode that is symmetric with respect to a first axis and asymmetric with respect to a second axis that is normal to the first axis, the first axis extending along a direction where the electrode has a longest dimension, the second axis passing through a midpoint between two ends of the electrode on the first axis, wherein an areal density distribution of the electrode along an axis has a plurality of local maxima, and wherein locations of the plurality of local maxima coincide with locations where a plurality of anti-nodal points at a vibrational resonance frequency are located.

14. The imaging device of claim 13, wherein each of the plurality of MUTs is a capacitive micromachined ultrasound transducer (cMUT).

15. The imaging device of claim 13, wherein each of the plurality of MUTs is a piezoelectric micromachined ultrasound transducer (pMUT).

16. The imaging device of claim 15, wherein each of the plurality of MUTs further comprises:
a substrate;
a membrane suspending from the substrate;
a bottom electrode disposed on the membrane; and
a piezoelectric layer disposed on the bottom electrode,
wherein the electrode is disposed on the piezoelectric layer.

17. The imaging device of claim 15, wherein the piezoelectric layer is formed of at least one of PZT, KNN, PZT-N, PMN—Pt, AlN, Sc—AlN, ZnO, PVDF, and LiNiO$_3$.

18. An imaging device, comprising:
a transducer array including a plurality of micromachined ultrasonic transducers (MUTs),
each of the plurality of MUTs comprising:
a symmetric electrode,
wherein an areal density distribution of the symmetric electrode along an axis has a plurality of local maxima and wherein locations of the plurality of local maxima coincide with locations where a plurality of anti-nodal points at a vibrational resonance frequency are located.

19. The imaging device of claim 18, wherein the vibrational resonance frequency has a symmetric vibrational mode.

20. The imaging device of claim 18, wherein each of the plurality of MUTs is a capacitive micromachined ultrasound transducer (cMUT).

21. The imaging device of claim 18, wherein each of the plurality of MUTs is a piezoelectric micromachined ultrasound transducer (pMUT).

22. The imaging device of claim 21, wherein each of the plurality of MUTs further comprises:
a substrate;
a membrane suspending from the substrate;
a bottom electrode disposed on the membrane;
a piezoelectric layer disposed on the bottom electrode; and
a top electrode disposed on the piezoelectric layer,
wherein the top electrode is the symmetric electrode.

23. The imaging device of claim 21, wherein the piezoelectric layer is formed of at least one of PZT, KNN, PZT-N, PMN—Pt, AlN, Sc—AlN, ZnO, PVDF, and LiNiO$_3$.

* * * * *

UNITED STATES PATENT AND TRADEMARK OFFICE
CERTIFICATE OF CORRECTION

PATENT NO. : 10,648,852 B2  
APPLICATION NO. : 15/951121  
DATED : May 12, 2020  
INVENTOR(S) : Sandeep Akkaraju et al.

Page 1 of 1

It is certified that error appears in the above-identified patent and that said Letters Patent is hereby corrected as shown below:

In the Claims

Column 11, Line 15-17, please delete:
"The imaging device of claim 15, wherein the piezoelectric layer is formed of at least one of PZT, KNN, PZT-N, PMN—Pt, AlN, Sc—AlN, ZnO, PVDF, and LiNiO3."

And replace with:
-- The imaging device of claim 16, wherein the piezoelectric layer is formed of at least one of PZT, KNN, PZT-N, PMN—Pt, AlN, Sc—AlN, ZnO, PVDF, and LiNiO3. --

Column 12, Line 22-24, please delete:
"The imaging device of claim 21, wherein the piezoelectric layer is formed of at least one of PZT, KNN, PZT-N, PMN—Pt, AlN, Sc—AlN, ZnO, PVDF, and LiNiO3."

And replace with:
-- The imaging device of claim 22, wherein the piezoelectric layer is formed of at least one of PZT, KNN, PZT-N, PMN—Pt, AlN, Sc—AlN, ZnO, PVDF, and LiNiO3. --

Signed and Sealed this  
Sixteenth Day of February, 2021

Drew Hirshfeld  
*Performing the Functions and Duties of the*  
*Under Secretary of Commerce for Intellectual Property and*  
*Director of the United States Patent and Trademark Office*